United States Patent [19]

Mohsen et al.

[11] Patent Number: 4,543,594
[45] Date of Patent: Sep. 24, 1985

[54] FUSIBLE LINK EMPLOYING CAPACITOR STRUCTURE

[75] Inventors: Amr M. Mohsen, Lake Oswego; Dwight L. Crook, Cornelius, both of Calif.

[73] Assignee: Intel Corporation, Santa Clara, Calif.

[21] Appl. No.: 716,593

[22] Filed: Mar. 27, 1985

Related U.S. Application Data

[63] Continuation of Ser. No. 415,247, Sep. 7, 1982, abandoned.

[51] Int. Cl.[4] .................. H01L 21/479; H01L 23/54; H01L 29/94; H01L 21/326
[52] U.S. Cl. ........................ 357/51; 357/71; 357/59; 357/45; 357/23.14; 357/23.6
[58] Field of Search .............. 357/23 C, 86, 45, 51, 357/23 MG, 13, 71 P, 59; 29/584; 361/100; 365/96, 103, 102

[56] References Cited

U.S. PATENT DOCUMENTS

| | | |
|---|---|---|
| 3,576,549 | 4/1971 | Hess et al. ............................. 357/45 |
| 3,634,929 | 1/1972 | Yoshida et al. ........................ 29/584 |
| 3,646,305 | 2/1972 | Schimidtke et al. ................... 29/584 |
| 3,717,852 | 2/1973 | Abbas et al. ......................... 365/103 |
| 3,781,977 | 1/1974 | Hulmes ................................. 357/45 |
| 3,787,822 | 1/1974 | Rioult ................................... 29/584 |
| 4,072,976 | 2/1978 | Harari .................................. 357/23 |
| 4,322,736 | 3/1982 | Sasaki et al. .......................... 357/86 |
| 4,375,086 | 2/1983 | Van Velthoven ................ 357/23 C |

Primary Examiner—Andrew J. James
Assistant Examiner—Sheila V. Clark
Attorney, Agent, or Firm—Blakely, Sokoloff, Taylor & Zafman

[57] ABSTRACT

A capacitor-like MOS structure which provides a fusible link useful in a ROM, redundancy circuit, or the like is disclosed. An oxide layer insulates a polysilicon electrode from a doped substrate region. A potential is applied between the electrode and the doped region of sufficient magnitude to cause the oxide to rupture and to cause permanent filaments to be formed within the oxide. The filaments provide permanent conductive links between the polysilicon electrode and the doped substrate region.

2 Claims, 2 Drawing Figures

FUSIBLE LINK EMPLOYING CAPACITOR STRUCTURE

BACKGROUND OF THE INVENTION

This application is a continuation of application Ser. No. 415,247, filed Sept. 7, 1982, now abandoned.

1. Field of the Invention.

The invention relates to fusible links, particularly links for metal-oxide-semiconductor (MOS) integrated circuits.

2. Prior Art.

In integrated circuits including MOS integrated circuits, there is often a need for discretionary connections which, once completed, permanently remain. These connections are sometimes made by opening a current path, as well as by closing a current path. Such discretionary connections are used, for example, to program read-only memories (ROMs), for programming redundant circuits in memories, for selecting useful circuits in wafer scale integration and for enabling features or disabling features in integrated circuits.

In some cases, electrically programmable and electrically erasable read-only memory (E2PROM) devices are employed for discretionary connections. These E2PROM devices are most useful when used as part of an E2PROM since then they may be readily fabricated with the memory. Electrically programmable read-only memory cells are more difficult to use since when used as part of an EPROM, they erase when the memory array is erased. A structure for preventing such erasure is described in "Light Shielded EPROM Cell", Ser. No. 389,415, filed June 17, 1982. This copending application is assigned to the assignee of the present application.

Most often, discretionary connections are made through use of fusible links. These links, when fabricated, provide a closed connection and are selectively "melted" to provide an open connection. In some cases, an electrical current is passed through the fusible link causing it to open. In other cases, a laser beam is used to melt the link. Examples of fusible links and related art are described in U.S. Pat. Nos. 3,792,319; 3,699,395; 3,699,403; 3,028,659; 3,191,151; 3,555,365; 3,564,354 and 3,570,114.

One problem with fusible links is that oxygen is generally required to burn or open a link. Thus the links are exposed to the air at the time the discretionary connections are made. Openings through the integrated circuits' passivation layer are used to expose the link to the atmosphere. These openings make the circuit more difficult to use in plastic packages since moisture is more likely to enter the circuit through these openings. Also, since the links are exposed to the atmosphere when blown, the discretionary connections are made at wafer sort, that is, prior to packaging. This prevents, for instance, programming redundant elements in the field to replace failed elements.

As will be seen, the present invention provides a fusible link in the form of a capacitor like structure. The structure can be fabricated with smaller geometries than prior art fusible links and, moreover, does not require oxygen to make the connections. Thus, the connections can be made with a complete passivation layer in place. This makes the integrated circuit more compatible with plastic packages and enables connections to be made after packaging in the field.

SUMMARY OF THE INVENTION

A capacitor-like, fusible link is described which is particularly useful for an integrated circuit formed on a silicon substrate. An insulative layer is formed on the substrate and an electrode is formed over this insulative layer. A current path disposed within the substrate extends beneath the insulative layer such that an electrical potential can be imposed across the insulative layer (between the current path and the electrode). Circuit means for selectively applying a potential across the insulative layer is provided. This potential is of sufficient magnitude to permanently deform the insulative layer so as to cause it to provide a permanent conductor between the current path and electrode. It is believed that silicon from the substrate or silicon from the electrode where a polysilicon electrode is used melts into pin holes in the insulative layer to provide the conductor.

DETAILED DESCRIPTION OF THE INVENTION

A fusible link in the form of a capacitor-like structure particularly useful in MOS circuits is described. In the following description, numerous specific details are set forth such as specific conductivity types in order to provide a thorough understanding of the presently preferred embodiment. It will be obvious to one skilled in the art, however, that the present invention may be practiced without these specific details. In other instances, well-known processing and structures have not been described in detail in order not to unnecessarily obscure the present invention.

Figure 1:
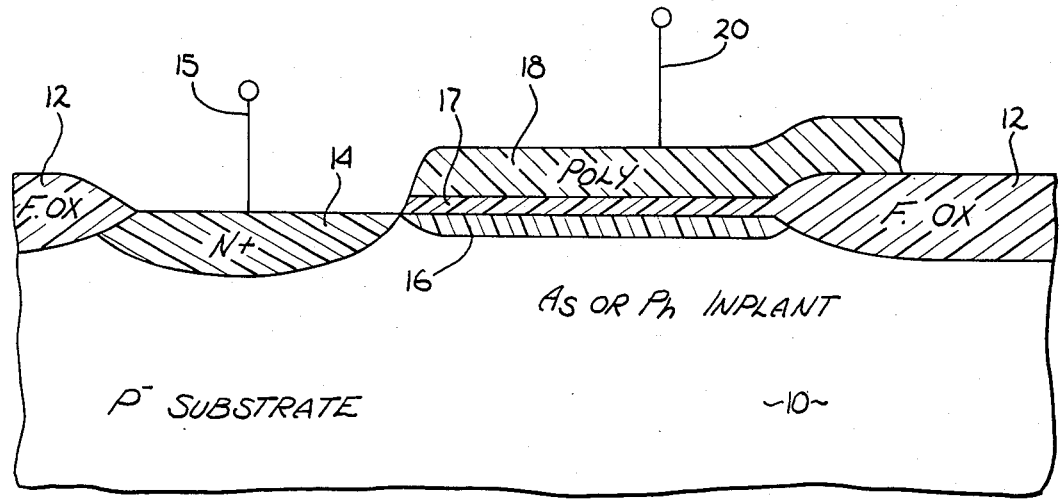
FIG. 1 is a cross-sectional elevation view of a substrate illustrating the presently preferred embodiment of the capacitor-like fusible link of the present invention.

Referring now to FIG. 1, the fusible link of the present invention is fabricated on a silicon substrate 10. In the presently preferred embodiment, the substrate is a p-type substrate and doped to a level of approximately 50 ohm-cm.. The fusible link is formed between field oxide regions 12 which regions are initially fabricated on the substrate in a well-known manner.

The fusible link comprises the capacitor-like structure having an electrode 18, an insulative layer 17 and a lower electrode which comprises a current path in the substrate 10. This path includes the n-type region 16 which is contiguous with the n+ region 14.

In the presently preferred embodiment, the insulative layer 17 comprises silicon dioxide which is grown on the substrate 10. This layer is between 50A–150A thick for reasons which will be described. The doped region 16 is ion implanted through this oxide layer with arsenic or phosphorus to a level of $1 \times 10^{14}/cm^2$. The electrode 18 is fabricated from polysilicon and in the presently preferred embodiment is approximately 5500A thick. The region 14 which is contiguous with region 16 is doped when the source/drain regions for the integrated circuit are formed. In its preferred embodiment, arsenic ion implantation is used to form the region 14 in alignment with the polysilicon electrode 18 (a doping level in the range of $10^{15}/cm^2$ is employed). The lines 15 and 20 are in practice realized as well-known metal contacts and as will be seen, permit a potential to be applied across the oxide layer 17 since the polysilicon electrode 18 is completely insulated from the substrate by layer 17 and the field oxide regions 12.

The entire structure using current production MOS processing is approximately 3 microns by 3 microns. A separate masking step is employed to obtain the layer 17 since the oxide in this layer is thinner than that generally used in the remainder of the integrated circuit. The electrode 18 is fabricated from a polysilicon layer, which layer is used to form gates, etc. for the integrated circuit. Electrode 18 may be fabricated from a first layer of polysilicon or from a second layer of polysilicon.

To make the discretionary connection between the lines 15 and 20 a potential is applied across these lines of sufficient magnitude to cause the oxide layer 17 to rupture. It is believed that conduction begins at the thinnest part of the oxide causing local heating. Then silicon from the substrate or polysilicon electrode melts to form a thin filament through pin holes in the oxide layer.

As mentioned, for the embodiment of FIG. 1, the oxide layer 17 is between 50A and 150A thick. In a typical integrated circuit using current MOS technology, the gate oxides for MOS devices are typically 250A thick. Approximately 10 to 20 volts is required to rupture the thinner oxide 17. This voltage may be handled by the transistors in the integrated circuit without damaging them. Thus, the 10–20 volts required to rupture oxide 17 may be coupled through the integrated circuit and selectively applied to those links which require fusing.

It has been learned that the fusing of the fusible link shown in FIG. 1 must be done with reasonable care. More particularly, it has been learned that, for the shown embodiment, 10–20 volts (DC) when applied through a resistor having approximately 1K ohm resistance, provides the most effective means for fusing the link. Test data has shown that where the oxide layer is approximately 100A thick and has an area between 10 to 500 (micro m)$^2$, fusion occurred at a voltage of 12 to 16 volts. The current required to cause this fusion is less than 0.1 microamps per micro m$^2$ of capacitor area. The fused link has a resistance of approximately 0.5 to 2K ohms. A link, once fused, can handle currents of up to 100 milliamps at room temperature for approximately a second before it heals to an open fuse. Taking into account electron migration wear-out, the predicted wear-out lifetime of a link, once fused, is substantially greater than $3 \times 10^8$ hours.

Figure 2:
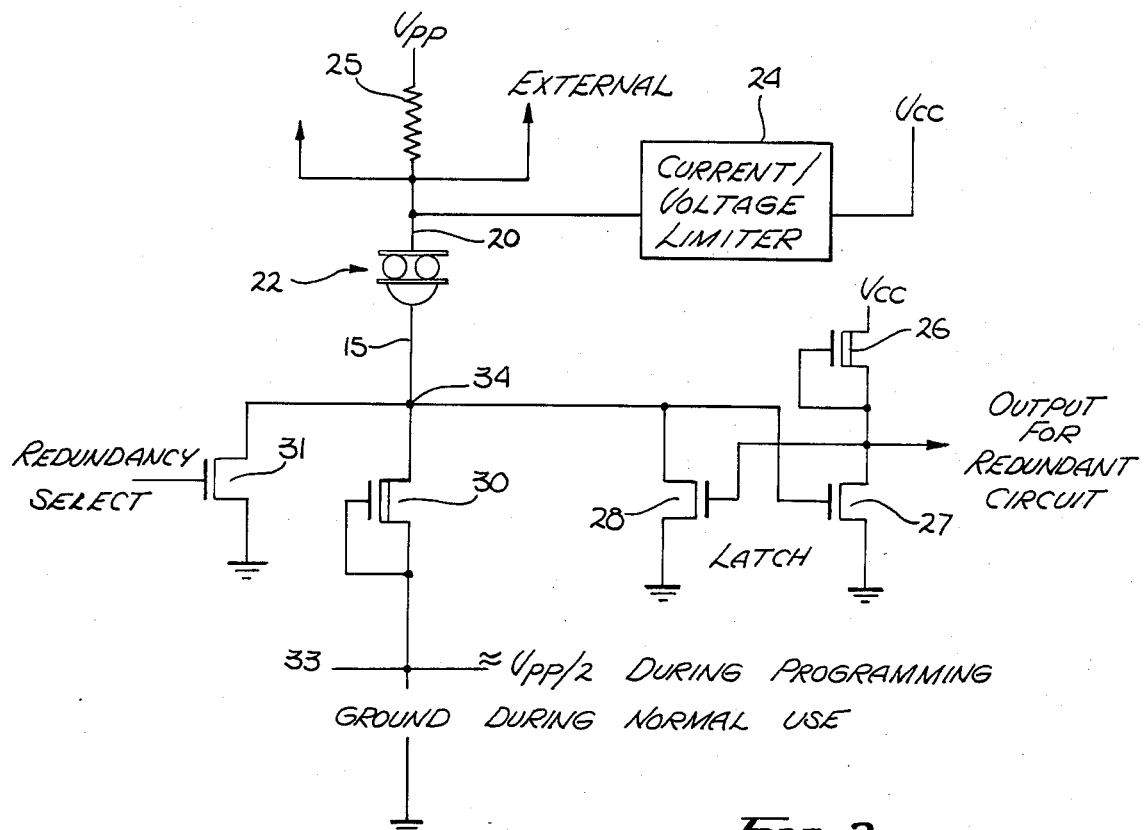
FIG. 2 is an electrical schematic showing the fusible link of the present invention as part of an integrated circuit, and more particularly, as part of a programming means for a redundant circuit.

In FIG. 2, the link 22 is shown as part of a redundancy circuit. These circuits are often used to enable redundant columns or rows in memories. The redundant columns or rows replace defective columns or rows once circuitry on the integrated circuit is programmed to recognize the address of the defective column or row and cause the redundant column or row to be selected in its place. A "Redundant Memory Circuit" is shown in U.S. Pat. No,. 4,250,570.

The capacitor-like fusible link of the present invention is shown as link 22 in FIG. 2. Line 20 is connected to a current/voltage limiter 24 and also to a resistor 25. This resistor in the presently preferred embodiment is external to the integrated circuit and has a resistance of approximately 1K ohms as previously mentioned. Resistor 25 interconnects link 22 with the "programming" potential, which is in the range of 10 to 20 volts depending on the oxide thickness used in the link. After fusing (programming), the resistor 25 and the potential $V_{pp}$ are of course not required. During normal (non-programming) operation of the integrated circuit the current/voltage limiter 24 interconnects the link 22 with the VCC potential to prevent a high potential or large current surge from inadvertently damaging the link 22 during normal operation. Ordinary current/voltage limiting means are used for limiter 24.

The line 15 which is common with node 34 of the circuit of FIG. 2 is coupled through transistor 30 to the potential $V_{pp}/2$ (node 33) during programming. Otherwise (during normal use) node 33 is coupled to ground potential. The depletion mode transistor 30 assures that the node 34 is drawn to ground potential during normal operation if the link 22 is open (not fused). If the link 22 is "shortened" (fused) node 34 is a $V_{CC}$ during normal operation causing transistor 27 to conduct. Node 34 is also selectively coupled to ground through the enhancement mode transistor 31 for purposes of fusing the link 22. The node 34 controls a latch which comprises the transistors 26, 27 and 28 during normal operation.

Assume first that the link 22 is open, that is, its oxide layer is not ruptured. During the programming mode, the programming potential is applied to link 22 through resistor 25. (The $V_{pp}$ potential is typically applied to a plurality of links in the integrated circuit through resistor 25.) Node 34 remains at $V_{pp}/2$ since node 33 is at that potential. The potential across the link ($V_{pp}/2$) is not great enough to fuse the link. So long as transistor 31 does not conduct, the link remains open. Now if a a potential is applied to the redundancy select line, (gate of transistor 31) node 34 is brought to ground potential. This causes a sufficient voltage to be applied across link 22 to fuse it. As mentioned, the resistor 25 assures that the current through the link is large enough to leave a conductive path, and yet not so large as to cause an open circuit.

If the link 22 is open, node 34 remains at ground potential since node 33 is coupled to ground potential in normal use. Transistor 27 does not conduct and the output line is drawn to $V_{cc}$ through transistor 26. On the other hand, if the link 22 has been fused, node 34 is drawn to $V_{cc}$ potential through the current/voltage limiter 24. (Transistor 30 does not conduct enough to draw the node 34 to ground potential.) With node 34 close to the $V_{cc}$ potential, transistor 27 conducts while transistor 28 is prevented from conducting. For this condition, the output line is low.

The structure of FIG. 1, although shown used in a redundancy circuit in FIG. 2 may be used in other circuits, such as read-only memories and other applications as mentioned in the prior art section of this application.

While in the presently preferred embodiment a silicon dioxide layer 17 is used, other insulative layers may be used such as a nitrodized oxide layer or a silicon nitride layer. In some applications, it may be desirable to have a silicon dioxide layer for the layer 17 while employing other insulative layers such as silicon nitride to insulate the gates of the field-effect transistors from the substrate. In this event, since the silicon nitride has a higher break-down potential, it may in fact be thinner than the layer 17, although its breakdown potential will be higher than that associated with layer 17.

Thus, a capacitor-like structure which provides a fusible link has been disclosed. The structure does not require oxygen to fuse the link and thus, programming can occur after the formation of a passivation layer.

We claim:

1. In an integrated circuit formed on a silicon substrate, an apparatus for providing a discretionary, permanent electrical connection, comprising:

an insulative layer between 50-150A thick and having an area between 10 to 500 (micro m)$^2$ disposed on said substrate;

an electrode formed of polysilicon material only formed on said insulative layer and insulated from said substrate;

a first doped substrate region of a first conductivity type disposed in said substrate beneath said electrode;

a second substrate region of said first conductivity type disposed in alignment with said electrode and being contiguous with said first region;

circuit means for selectively applying a potential between said electrode and said second layer of sufficient magnitude to permanently deform said insulative layer such that a permanent polysilicon electrical connection is formed between said electrode and said second region, said circuit means comprising a source of DC potential between 10 to 20 volts and a current limiting resistor of approximately 1000 ohms.

2. The apparatus defined by claim 1 wherein said insulative layer comprises silicon dioxide.

* * * * *